(12) United States Patent
Elzeftawi et al.

(10) Patent No.: US 10,554,450 B2
(45) Date of Patent: Feb. 4, 2020

(54) HIGH RESOLUTION VOLTAGE-MODE DRIVER

(71) Applicant: Samsung Display Co., Ltd., Yongin-si, Gyeonggi-do (KR)

(72) Inventors: Mohamed Elzeftawi, San Jose, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/054,902

(22) Filed: Aug. 3, 2018

(65) Prior Publication Data

US 2019/0288880 A1     Sep. 19, 2019

Related U.S. Application Data

(60) Provisional application No. 62/643,124, filed on Mar. 14, 2018.

(51) Int. Cl.
| | |
|---|---|
| *H04L 25/02* | (2006.01) |
| *H03K 19/0185* | (2006.01) |
| *H03M 1/68* | (2006.01) |
| *H03K 19/00* | (2006.01) |
| *H03M 1/00* | (2006.01) |

(52) U.S. Cl.
CPC ..... *H04L 25/0278* (2013.01); *H03K 19/0005* (2013.01); *H03K 19/018571* (2013.01); *H03K 19/018585* (2013.01); *H03M 1/002* (2013.01); *H03M 1/68* (2013.01); *H04L 25/0298* (2013.01)

(58) Field of Classification Search
None
See application file for complete search history.

(56) References Cited

U.S. PATENT DOCUMENTS

| | | | |
|---|---|---|---|
| 8,542,036 B2 | 9/2013 | Bae et al. | |
| 8,994,399 B2 | 3/2015 | Ali | |
| 9,065,399 B2 | 6/2015 | Wang et al. | |
| 9,231,631 B1 | 1/2016 | Ke et al. | |
| 9,369,128 B1* | 6/2016 | Tan | H03K 19/0005 |
| 9,413,381 B2 | 8/2016 | Vasani et al. | |
| 9,531,382 B1* | 12/2016 | Miwa | H03K 19/003 |
| 9,553,566 B2 | 1/2017 | Groen et al. | |
| 2010/0207680 A1* | 8/2010 | Kuwahara | H03K 19/0005 327/520 |
| 2012/0025800 A1* | 2/2012 | Dettloff | H04L 25/0272 323/299 |

* cited by examiner

*Primary Examiner* — Minh D A
*Assistant Examiner* — James H Cho
(74) *Attorney, Agent, or Firm* — Lewis Roca Rothgerber Christie LLP

(57) ABSTRACT

A method of performing coarse calibration of a voltage-mode (VM) driver having a plurality of driver slices connected in parallel includes setting a control code applied to activated driver slices of the plurality of driver slices to a maximum value to minimize an output resistance of the activated driver slices, activating one driver slice of the plurality of driver slices by applying the control code to the one driver slice, while disabling other driver slices of the plurality of driver slices, measuring an output resistance of the VM driver, determining whether the output resistance of the VM driver is greater than a desired resistance, and in response to determining that the output resistance of the VM driver is greater than a desired resistance activating one more driver slice of the plurality of driver slices.

20 Claims, 9 Drawing Sheets

HIGH RESOLUTION VOLTAGE-MODE DRIVER

CROSS-REFERENCE TO RELATED APPLICATION(S)

This application claims priority to, and the benefit of, U.S. Provisional Application No. 62/643,124, entitled "HIGH RESOLUTION VOLTAGE-MODE DRIVER," filed on Mar. 14, 2108, the entire content of which is incorporated herein by reference.

FIELD

Aspects of the present invention relate to a voltage-mode driver.

BACKGROUND

High speed transmission systems are used to connect discrete electrical circuits or devices. Voltage-mode (VM) drivers are used to convert a digital input signal to an analog output that can be transmitted over a low-impedance transmission line. It is important to match the output impedance of the VM drivers to the low impedance transmission line to reduce (e.g., minimize) reflections on the line. As such, it is desirable to be able to calibrate the output impedance of the VM driver to match the desired line impedance within acceptable limits. Some approaches in the related art involve splitting the VM driver into parallel slices, which are selectively enabled/disabled to achieve the desired output impedance. However, bringing on board many slices drives up power used by the predriver.

What is desired is a way of improving resolution of calibration while also reducing (e.g., minimizing) driver power consumption.

The above information disclosed in this Background section is for enhancement of understanding of the invention, and therefore it may contain information that does not form prior art that is already known to a person of ordinary skill in the art.

SUMMARY

Aspects of embodiments of the present invention are directed toward a system and method for calibrating the output resistance of a voltage-mode driver.

According to some exemplary embodiments of the invention, there is provided a method of performing coarse calibration of a voltage-mode (VM) driver including a plurality of driver slices connected in parallel, the method including: setting, by a processor, a control code applied to activated driver slices of the plurality of driver slices to a maximum value to minimize an output resistance of the activated driver slices; activating, by the processor, one driver slice of the plurality of driver slices by applying the control code to the one driver slice, while disabling other driver slices of the plurality of driver slices; measuring, by the processor, an output resistance of the VM driver; determining, by the processor, whether the output resistance of the VM driver is greater than a desired resistance; in response to determining that the output resistance of the VM driver is greater than a desired resistance: activating, by the processor, one more driver slice of the plurality of driver slices; and in response to determining that the output resistance of the VM driver is less than or equal to the desired resistance: determining, by the processor, whether a total number of activated driver slices is greater than or equal to a lowest desirable number of on slices; and in response to determining that the total number of activated driver slices is less than the lowest desirable number of on slices, reducing, by the processor, the control code applied to activated driver slices.

In some embodiments, the control code is a digital code having a plurality of bits.

In some embodiments, disabling other driver slices of the plurality of driver slices includes applying, by the processor, an internal control code having a minimum value to the other driver slices.

In some embodiments, the method further includes, in response to determining that the output resistance of the VM driver is greater than a desired resistance: re-measuring, by the processor, the output resistance of the VM driver; and determining, by the processor, whether the re-measured output resistance is greater than the desired resistance.

In some embodiments, reducing the control code applied to activated driver slices includes: determining, by the processor, whether the control code is greater than one least significant bit (LSB); in response to determining that the control code is greater than one LSB, reducing, by the processor, the control code by one least significant bit (LSB).

In some embodiments, the method further includes, in response to determining that the control code is less than or equal to one LSB, storing, by the processor, a value of the control code as a coarse control code.

In some embodiments, the method further includes, in response to determining that the total number of activated driver slices is greater than or equal to the lowest desirable number of on slices, storing, by the processor, a value of the control code as a coarse control code.

In some embodiments, the output resistance of the VM driver is a pull-up resistance or a pull-down resistance of the VM driver.

According to some exemplary embodiments of the invention, there is provided a method of performing fine calibration of a voltage-mode (VM) driver including a plurality of driver slices connected in parallel, the method including: setting, by a processor, a fine control code applied to activated fine driver slices of the plurality of driver slices to a maximum value to minimize an output resistance of the activated driver slices; activating, by the processor, one fine driver slice of the plurality of driver slices, while disabling other driver slices of the plurality of driver slices; measuring, by the processor, an output resistance of the VM driver; determining, by the processor, whether the output resistance of the VM driver is greater than a desired resistance; in response to determining that the output resistance of the VM driver is greater than a desired resistance: activating, by the processor, one more driver slice of the plurality of driver slices by applying the fine control code or a previously stored coarse control code based on the one more driver slice being a fine driver slice or a coarse driver slice; and in response to determining that the output resistance of the VM driver is less than or equal to the desired resistance: determining, by the processor, whether a total number of activated driver slices is greater than or equal to a lowest desirable number of on slices; and in response to determining that the total number of activated driver slices is less than the lowest desirable number of on slices, reducing, by the processor, the fine control code applied to activated fine driver slices.

In some embodiments, disabling other driver slices of the plurality of driver slices includes: applying, by the processor, an internal control code having a minimum value to the other driver slices.

In some embodiments, the one more driver slice is a fine driver slice of the plurality of driver slices, and the activating the one more driver slice includes applying, by the processor, the fine control code to the one more driver slice.

In some embodiments, the one more driver slice is a coarse driver slice of the plurality of driver slices, and the activating the one more driver slice includes applying, by the processor, the previously stored coarse control code to the one more driver slice.

In some embodiments, the plurality of driver slices includes one or more fine driver slices and one or more coarse driver slices, and the activating the one more driver slice includes activating, by the processor, one of the one or more coarse driver slices only when all of the one or more fine driver slices have been activated.

In some embodiments, a number of the one or more coarse driver slices is greater than a number of the one or more fine driver slices.

In some embodiments, the method further includes, in response to determining that the output resistance of the VM driver is greater than a desired resistance: re-measuring, by the processor, the output resistance of the VM driver; and determining, by the processor, whether the re-measured output resistance of the VM driver is greater than the desired resistance.

In some embodiments, reducing the control code applied to activated driver slices includes: reducing, by the processor, the control code by one least significant bit (LSB).

In some embodiments, the fine control code has a value higher than that of the previously stored coarse control code.

According to some exemplary embodiments of the invention, there is provided a voltage-mode (VM) driver including: a plurality of driver slices, each of the driver slices including: a drive transistor coupled to an output of the VM driver and configured to activate in response receiving a driving signal D1 at a gate electrode of the drive transistor; a plurality of binary weighed transistors coupled in parallel between a regulated voltage supply source and the drive transistor, and configured to adjust an output impedance of the VM driver in response to code bits of a control code received at the gates of the plurality of binary weighed transistors; and a controller configured to calibrate the output impedance of the VM driver by supplying the control code to the plurality of binary weighed transistors.

In some embodiments, the drive transistor includes a pull-up transistor, the driving signal is a pull-up driving signal, and the output impedance is a pull-up output impedance.

In some embodiments, the drive transistor includes a pull-down transistor, the driving signal is a pull-down driving signal, and the output impedance is a pull-down output impedance.

BRIEF DESCRIPTION OF THE DRAWINGS

The above and other features and aspects of the invention will be made more apparent by the following detailed description of exemplary embodiments thereof with reference to the attached drawings, in which.

DETAILED DESCRIPTION

Figure 1:
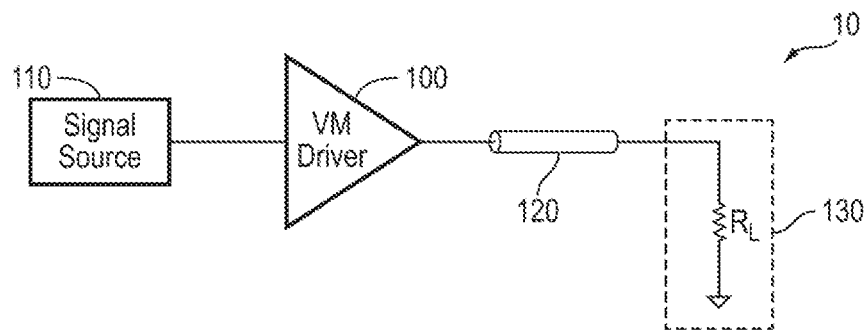
FIG. 1 is a schematic diagram of a data transmission system incorporating a voltage-mode (VM) driver according to some exemplary embodiments of the present invention.

The attached drawings for illustrating exemplary embodiments of the invention are referred to in order to provide a sufficient understanding of the invention, the merits thereof, and the objectives accomplished by the implementation of the invention. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art.

Hereinafter, the invention will be described in detail by explaining exemplary embodiments of the invention with reference to the attached drawings. In the drawings, like reference numerals are used throughout the figures to reference like features and components.

Aspects of embodiments of the present invention are directed to a self-calibrating, high-resolution, voltage-mode driver.

FIG. 1 is a schematic diagram of a data transmission system 100 incorporating the voltage mode driver 102 according to some exemplary embodiments of the present invention.

Referring to FIG. 1, in the data transmission system 10, the voltage-mode driver 100 (e.g., the high-resolution, low-power, voltage-mode driver; hereinafter referred to as a VM driver) receives an input signal from a signal source (e.g., a signal generating circuit or transmitter) 110 and drives a corresponding analog voltage signal at an input of a conductor 120 for propagation to a load circuit (e.g., a receiver) 130. The signal source 110 may be any suitable circuit (e.g., any analog and/or digital circuit) capable of generating a signal recognizable by the VM driver 100. In some examples, the conductor 120 may be any suitable transmission line such as a data line or a bus line in an integrated circuit, a circuit board trace, a wire, or cable outside an integrated circuit, or the like. The conductor 120 may be made of any suitable material such as metal (e.g., copper, gold, etc.), polysilicon, and/or the like. The load circuit 130 is any circuit that exhibits appropriate termination for the transmission line and is capable of receiving the propagated digital voltage signal.

The VM driver 100 shown in FIG. 1 is a single-ended driver. However, embodiments of the present invention are not limited thereto, and the embodiments of the present invention are also applicable to a fully differential driver.

Figure 2:
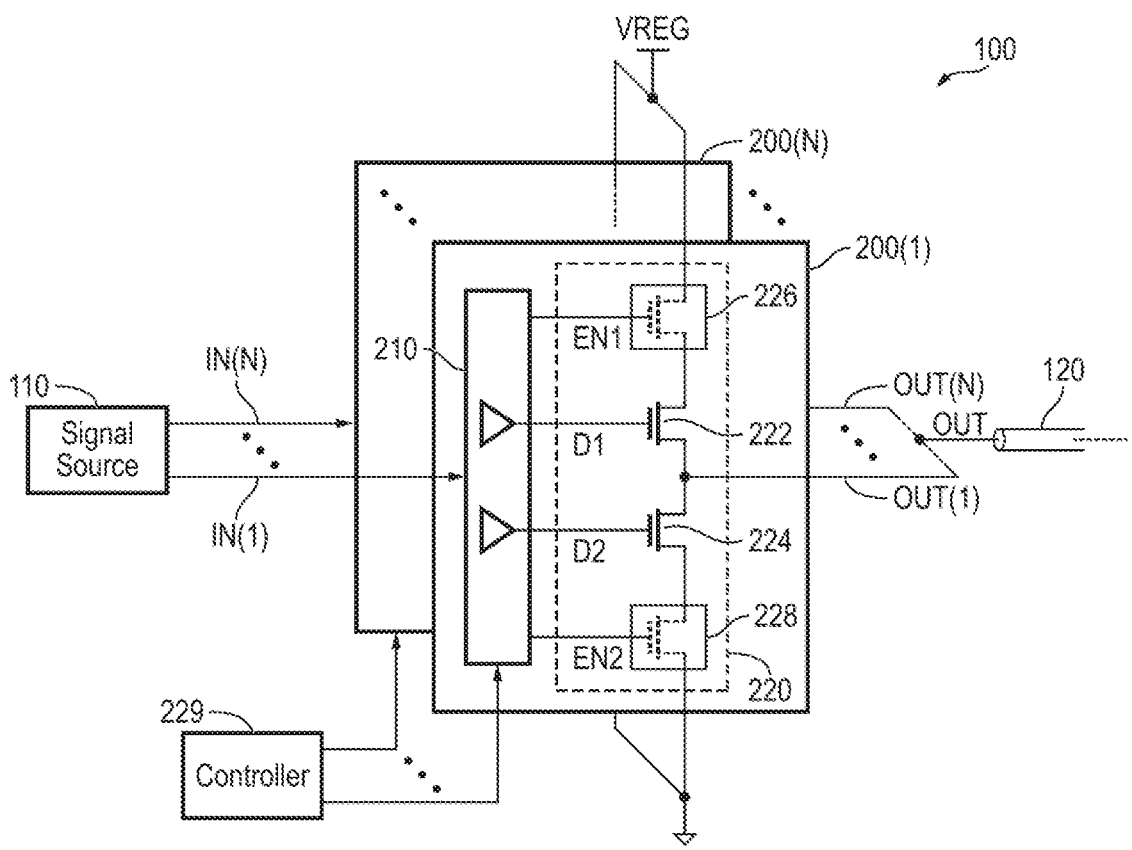
FIG. 2 is a schematic diagram illustrating the VM driver according to some embodiments of the present invention.

FIG. 2 is a schematic diagram illustrating the VM driver 100 according to some embodiments of the present invention.

According some embodiments, the VM driver 100 includes N-paralleled driver slices 200(1) to 200(N) (where N is an integer greater than 1) for driving the impedance-matched transmission line 120. The N outputs OUT(1) to OUT(N) of the driver slices 200(1) to 200(N) may be connected in parallel so as to provide an aggregate output impedance that approximately matches the characteristic impedance of the conductor 120. The driver slices 200(1) to 200(N) may also share a common regulated voltage supply source VREG and low voltage supply source (e.g., ground) connection. The voltage of the regulated power supply source VREG may determine output swings of the VM driver 100. In some examples, the power supply voltage VREG may be supplied by a voltage regulator and, such as in the case of an N/N VM driver, may be 25% to 50% of the supply voltage VDD. In other examples, such as in the case of a P/N VM driver, the power supply voltage VREG may be 50% to 100% of the supply voltage VDD.

Each of the driver slices 200(1) to 200(N) includes a pre-driver stage 210 and a driver stage 220. Each pre-driver stage 210 receives a corresponding one of the input signals IN(1) to IN(N) received from the signal source 102 and produces complementary driving signals D1 and D2 (which are complimentary and have opposite polarities) for driving the pull-up and pull-down circuits, respectively, of the driver stage 220 (e.g., for driving the gates of the pull-up and pull-down transistors (e.g., first and second drive transistors) 222 and 224, respectively). However, embodiments of the present invention are not limited thereto, and in some examples, each pre-driver stage 210 may receive the same input signal and may be individually enabled/disabled, independent of the other pre-driver stages 210.

According to some embodiments, The driver stage 220 includes a first enable block 226 and a second enable block 228 for enabling the pull-up and pull-down circuits, respectively, in response to first and second enable signals EN1 and EN2 received from a controller 229. The first enable block 226 of the pull-up circuit may be connected between the power supply voltage VREG and the pull-up transistor 222, and the second enable block 228 of the pull-down circuit may be connected between the pull-down transistor 224 and the low voltage supply source (e.g., ground). In some examples, each of the first and second enable blocks 226 and 228 may be a single transistor, such as an NMOS transistor; however, embodiments of the present invention are not limited thereto, as will be described in further detail below.

According to some embodiments, the first and second enable signals EN1 and EN2 supplied by the controller 229 to each driver slice 200 may be different. That is, in some examples, depending on the first and second enable signals EN1 and EN2 applied to each driver lice 200, some driver slices 200 may have only their pull-up circuits or their pull-down circuits enabled, while some driver slices 200 may both or neither of their pull-up and pull-down circuits enabled. In an example, a VM driver 100 may have 16 pull-up circuits and only 12 pull-down circuits enabled.

To reduce (e.g., minimize) signal reflections and to increase (e.g., maximize) signal transmission through the conductor 120, the VM driver 100 (i.e., the driver stage) may have an output impedance that is within a set range of the characteristic impedance of the conductor. For example, when utilizing a conventional conductor 120 having a characteristic impedance of 50 Ω, it may be desired to have the output impedance of the VM driver 100 be within 5% of that value, that is, be between 47.5 Ω to 52.5 Ω.

According to some embodiments, a controller 229 calibrates (e.g., adjusts) the output impedance of VM driver 100 by enabling (or turn on) certain slices 200 via the first and second enable signals EN1 and EN2, while disabling (or turning off) others.

Generally, due to process, voltage, and temperature (PVT) variations, as well as other factors, the I-V characteristics of the transistors (e.g., NMOS transistors) used in the driver stage 220, may vary. Due to these variations, some transistors may be at fast PVT corners and exhibit low output resistance, while others may be at slow PVT corners and exhibit high output resistance. As a result, different driver slices $200_1$ to $200_N$ may exhibit different output resistances.

To calibrate the output impedance, the controller 229 may turn off (or disable) some of the slices 200 in the faster (lower resistance) corners. However, when variation across PVT corners is large, in fast (low resistance) corners only a small number of slices 200 remain on. Given that calibration resolution is inversely proportional to the number of ON-slices 200, calibration resolution may become unacceptably bad in fast corners. Finding a method to reach the desired output impedance (e.g., 50 Ω) while turning on more slices may improve calibration resolution, but it comes at the cost of greater power consumption. This will described in more detail with reference to FIGS. 3 and 4.

Figure 3:
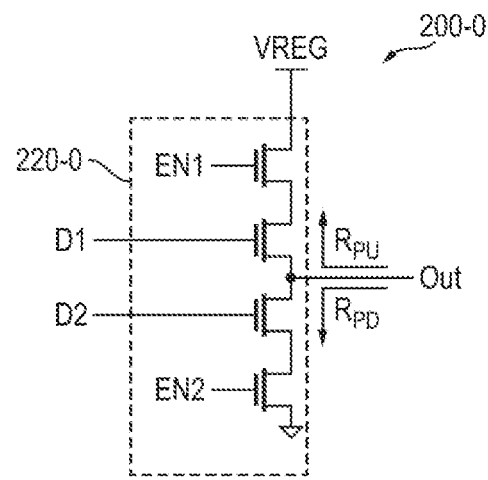
FIG. 3 illustrates a VM driver according to a comparative example.
Figure 4:
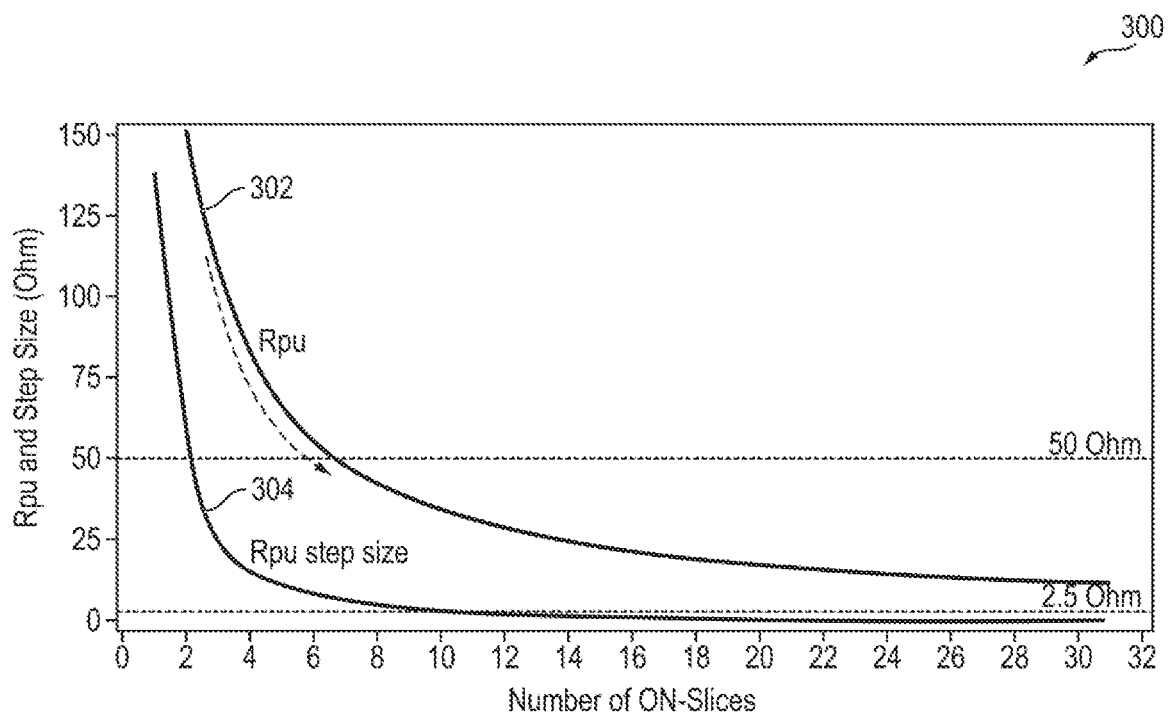
FIG. 4 illustrates the effect of calibration on the comparative example of FIG. 3.

FIG. 3 illustrates a voltage-mode driver according to a comparative example. FIG. 4 illustrates the effect of calibration on the comparative example of FIG. 3.

Referring to FIG. 3, in a comparative example, each of the first and second enable blocks may be a single transistor (e.g., NMOS transistor), the gate of which is controlled by a respective one of the first and second enable signals EN1 and EN2 from the controller 229.

As shown by resistance-vs-number-of-slices curve 302 of FIG. 4, with each driver slice 200-0 of the comparative example that is turned on, the pull-up output resistance/impedance (Rup) of the driver decreases. Indeed, there is an inverse relationship between the pull-up output resistance and the number of active driver slices 200-0. Further, as shown by curve 304 of FIG. 4, the output impedance step size, which represents a difference in successive values of the curve 302, also decreases as the number of active or on slices 200-0 increases. The output impedance step size represents the calibration resolution. According to this comparative example, it appears that the desired output impedance of about 50 Ω may be achieved by activating 7 slices. However, the calibration resolution at 7 slices is about 5 Ω or about 10% of the desired value. As a result, at 7 slices, the calibration does not guarantee that the desired output impedance resolution can be achieved across PVT corners. To obtain the desired calibration resolution of 2.5 Ω (or 5% of 50 Ω), 12 driver slices should be turned on. However, at 12 slices, the output impedance drops to about 30 Ω, which is far from the desired 50 Ω.

Embodiments of the present invention solve this problem by dividing the driver slices 200 into coarse driver slices and fine driver slices, and performing coarse and fine calibration on the coarse and fine driver slices, respectively, of the VM driver 100.

Figure 5:
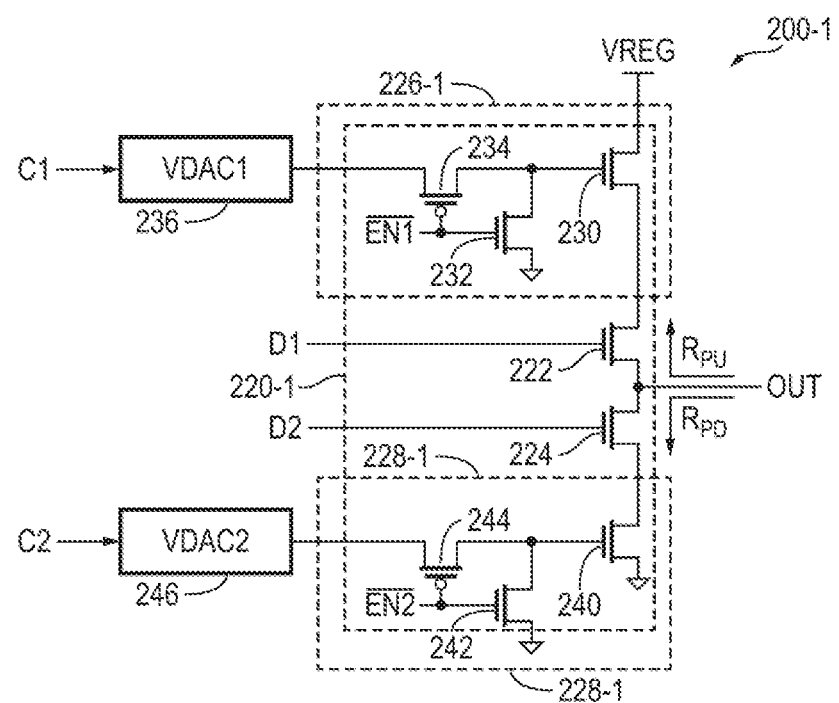
FIG. 5 is a schematic diagram of a driver stage of a coarse driver slice capable of separately and independently calibrating the pull-up and pull-down output resistances of the VM driver, according to some embodiments of the present invention.
Figure 6A:
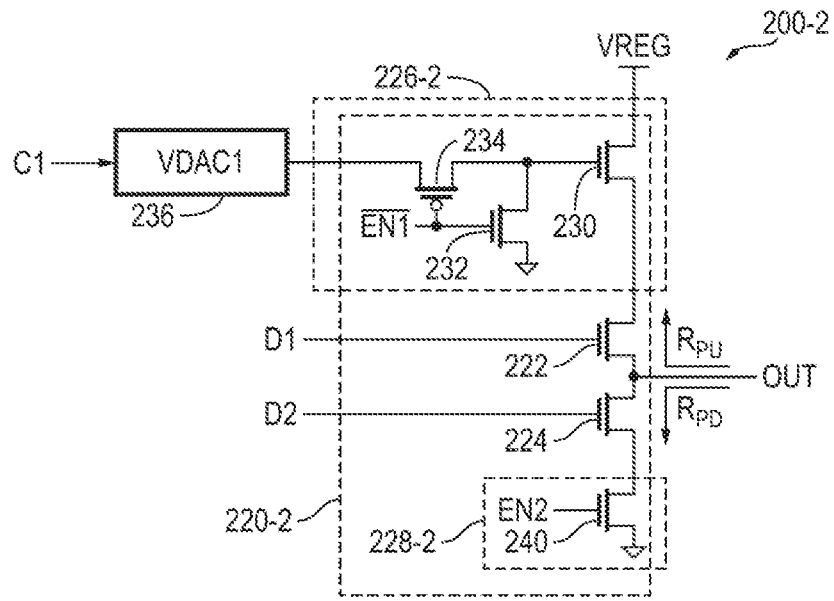
FIG. 6A-6B are schematic diagram of a driver stage of a coarse driver slice and a fine driver slice of a fine driver slice capable of directly calibrating the pull-up output resistance of the VM driver, according to some embodiments of the present invention.
Figure 6B:
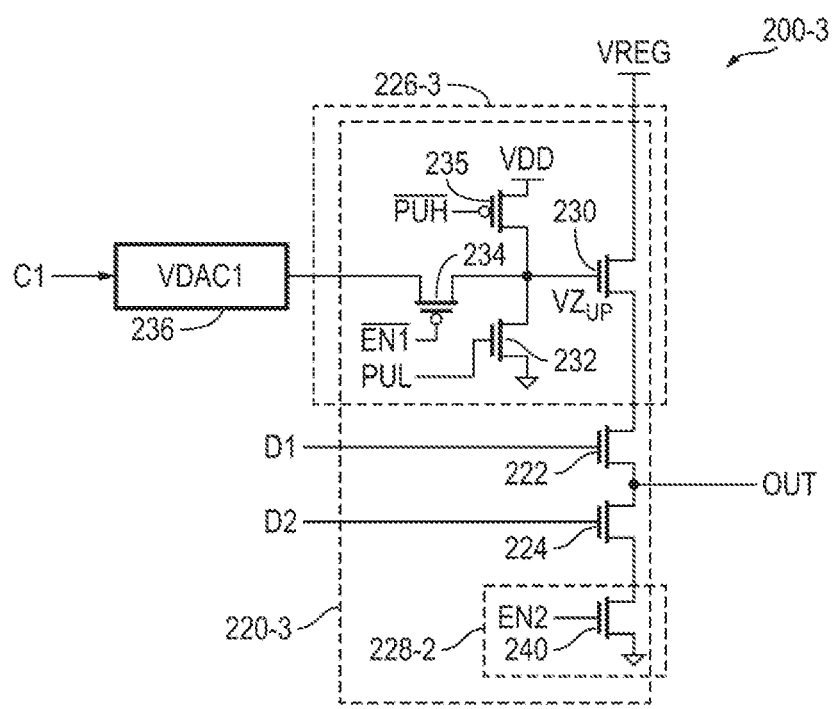
Figure 7A:
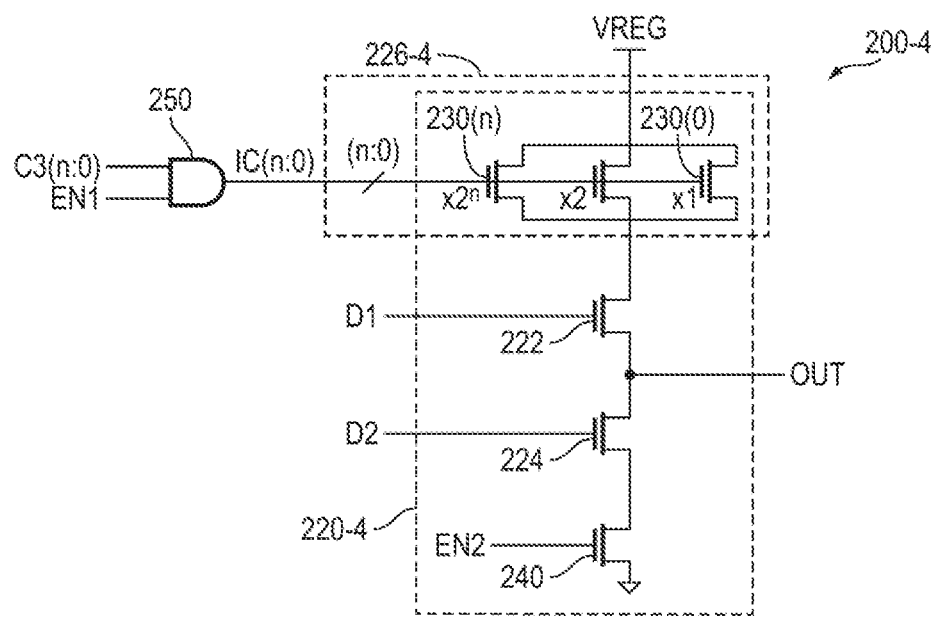
FIG. 7A-7B are schematic diagrams of driver stages of a coarse driver slice and a fine driver slice, respectively, of a VM driver capable of directly calibrating the pull-up output resistance of the VM driver, according to some other embodiments of the present invention.
Figure 7B:
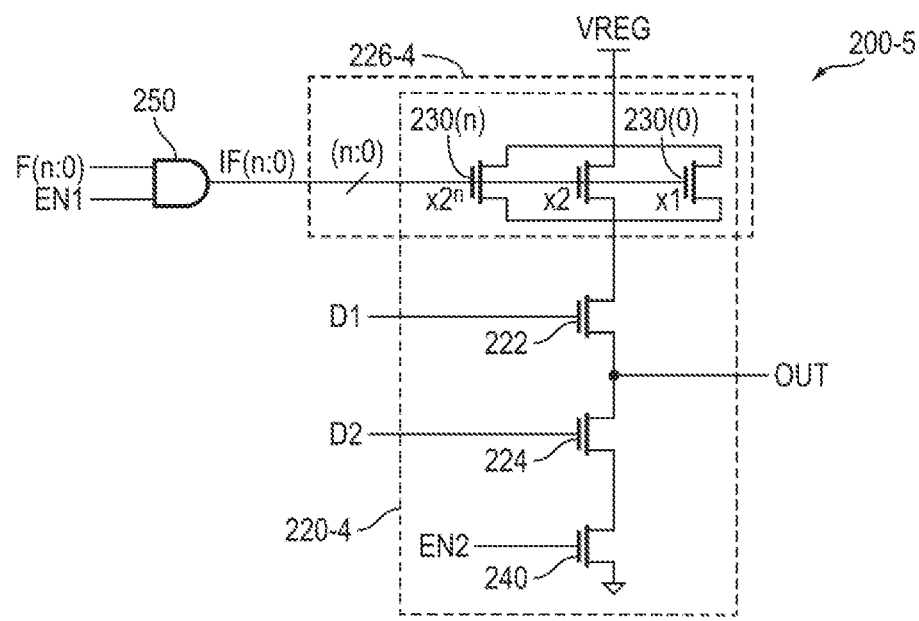

FIG. 5 is a schematic diagram of a driver stage 220-1 of a coarse driver slice 200-1 capable of separately and independently calibrating the pull-up and pull-down output resistances (Rpu and Rpd) of the VM driver 100-1, according to some embodiments of the present invention. FIG. 6A and FIG. 6B are schematic diagram of a driver stage 220-2 of a coarse driver slice 200-2 and a fine driver slice 200-3 of a fine driver slice 200-3 capable of directly calibrating the pull-up output resistance (Rpu) of the VM driver 100-2, according to some embodiments of the present invention. FIG. 7A and FIG. 7B are schematic diagrams of driver stages 220-4 of a coarse driver slice 200-4 and a fine driver slice 200-5, respectively, of a VM driver 100-3 capable of directly calibrating the pull-up output resistance (Rpu) of the VM driver 100-3, according to some other embodiments of the present invention.

Herein, each of the VM drivers 100-1, 100-2, and 100-3 is the same or substantially the same as the VM driver 100 of FIG. 2, except for differences between the corresponding one of the driver slices 200-1, 200-2, 200-3, 200-4, and 200-5, and the driver slice 200 of FIG. 2. Further, each of the driver slices 200-1, 200-2, 200-3, 200-4, and 200-5 is the same or substantially the same as the driver slice 200 of FIG. 2, except for differences between the corresponding one of first and second enable blocks 226-1, 226-2, 226-3, 226-4, 228-1, and 228-2, and the first and second enable blocks 226 and 228 of FIG. 2. As such, a description of common elements may not be repeated here for the sake of clarity and brevity.

Referring to FIG. 5, in some embodiments, the driver stage 220-1 of a coarse slice 200-1 includes first and second enable blocks 226-1 and 228-1, which are capable of directly and independently adjusting (e.g., controlling) the pull-up and pull-down output resistances Rpu and Rpd, respectively, of the driver stage 220-1, and hence, of the VM driver 100.

According to some embodiments, the first enable block 226-1 includes an impedance transistor 230 connected between the power supply voltage VREG and the pull-up transistor 222, a disable transistor 232 connected between a gate of the impedance transistor and the low power supply source (e.g., ground), and a pass-through transistor 234 connected between the gate of the impedance transistor 230. In some embodiments, a programmable voltage source, such as a voltage digital-to-analog converter (VDAC) 236 (e.g., a 3-bit VDAC) is connected to the pass-through transistor 236. The gates of the disable transistor 232 and the pass-through transistor 234 are connected together and controlled by an inverse enable signal ~EN1 from the controller 229. When the coarse driver slice 200-1 is activated by the controller 229, the disable transistor 232 turns off and the pass-through transistor 234 turns on, thus connecting the output of the programmable voltage source 236 to the gate of the impedance transistor 230. At this point, the on-resistance of the impedance transistor 230 is determined by (and has an inverse relationship with) its gate-to-source voltage VGS, which is set by the programmable voltage source 236. The output voltage of the programmable voltage source 236 may vary (e.g., vary in discrete and quantized steps) between a voltage of a low voltage supply source (e.g., 0 V or ground) and a voltage of a high voltage supply source VDD, based on a coarse control code C1 from the controller 229. Thus, by adjusting the voltage at the gate of the impedance transistor 230, the programmable voltage source 236 (and thus, the controller 229) can set or adjust the pull-up resistance of the driver stage 220-1. In some embodiments, the same the programmable voltage source 236 is shared across all driver stages 220-1 (and therefore shared by all first enable blocks 226-1 of all driver stages 220-1).

In some examples, the high voltage supply source VDD may be a function of the process used. For example, in 28 nm processes, the high voltage supply source VDD may be between 0.75 V and 1.25 V (e.g., 1 V).

As illustrated in FIG. 5, according to some embodiments, the pull-up and pull-down transistors 222 and 224, the impedance transistor 230, and the disable transistor 232 are NMOS transistors, and the pass-through transistor 234 is a PMOS transistor. However, embodiments of the present invention are not limited thereto, and, as recognized by a person of ordinary skill in the art, the transistor types of the could be reversed if the polarity of the driving signals D1 and D2 and the inverse enable signals ~EN1 and ~EN2 are also reversed.

According to some embodiments, the second enable block 228-1 is identical to or substantially identical to the first enable block 226-1. In other words, the second impedance transistor 240, the second disable transistor 242, and the second pass-through transistor 244, as well as the second programmable voltage source 246 the same or substantially the same as, and connected together in the same or substantially the same manner, as the corresponding elements/components in the first enable block 226-1. As such, a detailed description of the second enable block 228-1 will not be repeated here. The first and second enable blocks are independently controlled by the controller 229, and thus the controller 229 can separately and independently calibrate (e.g., directly adjust) the pull-up output resistance Rpu and the pull-down output resistance Rpd. For example, the gate-to-source voltages of the impedance transistors 230 and 240 may be different.

Because the source of the impedance transistor 240 is connected to the low voltage supply source (e.g., ground) while the source of the impedance transistor 230 is often at a higher voltage (e.g., at about VREG/2), the gate-to-source voltage VGS of the impedance transistor 240 is often greater than that of the impedance transistor 230 when their respective gates are driven by the same voltage. As a result, the pull-up output resistance Rpu of the driver stage 220 may be greater than the pull-down output resistance Rpd. Similarly, PVT corners may have a greater effect on the pull-up circuit than the pull-down circuit. Consequently, in calibrating the driver stage 220, it may be more important (and more difficult) to calibrate the first enable block 226 than the second enable block 228. As such, in some embodiments, the second enable block 228 may be replaced with a single transistor, and the pull-down resistor Rpd may reach the desired value by virtue of turning on a sufficient number of driver slices to calibrate the pull-up resistance Rpu.

Such embodiments are shown in FIG. 6A, in which the coarse driver slice 200-2 is the same or substantially the same as the driver slice 200-1 of the embodiments of FIG. 5, except for the second enable block 228-2 that is different from the second enable block 228-1 of FIG. 5. Here, the second enable block 228-2 includes an impedance transistor 240 that is connected between the low supply voltage (e.g., ground) and the pull-down transistor 224 and has a gate electrode that is driven by the second enable signal EN2 from the controller 229. As provided above, for any given driver slice 200-2/200-3, the first and second enable signals EN1 and EN2 may be the same or different.

According to some embodiments, programmable voltage sources 236 and 246 is common to (e.g., shared by) all coarse driver slices. However, embodiments of the present invention are not limited thereto, and one or more coarse driver slices may utilize programmable voltage sources that are different from the programmable voltage sources of other coarse driver slices.

The fine driver stage 220-3 of the fine driver slice 200-3, according to some embodiments, which corresponds to the coarse driver stage 220-2 of coarse driver slice 200-2 of FIG. 6A, is illustrated in FIG. 6B.

Referring to FIG. 6B, the fine driver stage 220-3 is the same or substantially the same as the driver stage 220-2 of the embodiments of FIG. 6A, except for the first enable block 226-3 that is different from the first enable block 226-2 of FIG. 6A. Here, the first enable block 226-3 further includes an enable transistor 235 that is connected between the high voltage supply source VDD and the gate of the impedance transistor 230 and has a gate that is driven by an inverse pull-up high signal PUH, which is provided by the controller 229. Further, the gate of the disable transistor 232 is driven by a pull-up low signal PUL, which is also provided by the controller 229. In some examples, the inverse pull-up high signal PUH may be an inverse of a pull-up low signal PUL; however, embodiments of the present invention are not limited thereto.

The disable and enable transistors 232 and 235 allow the controller 229 to override the voltage output by the programmable voltage source 236 by connecting the gate of the impedance transistor 230 to the low voltage supply source (e.g., ground or the high voltage supply source VDD irrespective of the voltage being output by the programmable voltage source 236, which may be shared by all of the driver slices 220-2 and 220-3. In some examples, the enable transistor 235 may be a PMOS transistor.

However, embodiments of the present invention are not limited thereto, and the enable transistor 235 may be an NMOS transistor if the polarity of its driving signal is also reversed.

Referring to FIG. 7A, in some embodiments, the driver stage 220-4 replaces the programmable voltage source 236 and the disable and pass-through transistors 232 and 234 of the first enable block 226-1 with a plurality of binary weighed transistors of the first enable block 226-4 that are driven by a multi-bit code. In some embodiments, the first enable block 226-4 includes the plurality of binary weighed transistors 230(0) to 230(n) (n being an integer greater than 1) that are connected in parallel between the power supply voltage VREG and the pull-up transistor 222. In some embodiments, the plurality of first to nth binary weighed transistors 230(0) to 230(n) have channel width-to-length ratios (W/L) that are W/L . . . $2^n$*W/L, respectively, and receive at their respective gate electrodes internal code bits IC(0), . . . , IC(n). Here, the internal code bit IC(0) represents a least significant bit (LSB), and IC(n) represents a most significant bit (MSB) of an internal coarse control code IC(n:0) received from the controller 229. Using the internal coarse control code IC(n:0), the controller 229 can adjust the resistance of the first enable block 226-4 as desired.

According to some embodiments, the controller 229 applies the same coarse control code C3(n:0) to all coarse driver slices 200-4, however, only enabled coarse driver slices 200-4 receive the code in the form of the internal coarse code IC(n:0). In some examples, this may be accomplished via an AND logic operator 250 acting on the coarse control code C3(n:0) and the first enable signal EN1. If the first enable signal EN1 of the coarse slice 200-4 is high (e.g., a high voltage such as VDD), the coarse control code C3(n:0) is passed onto the coarse slice 200-4 as internal coarse code IC(n:0), and corresponding ones of the plurality of binary weighed transistors 230(0) to 230(n) are activated/deactivated accordingly. If, however, the first enable signal EN1 is low (e.g., a low voltage, such as ground), the coarse control code C3(n:0) is not passed onto the coarse driver slice 200-4, and the internal coarse code IC(n:0) becomes all zeros, which in turn deactivates (turns off) all of the plurality of binary weighed transistors 230(0) to 230(n), thus disabling the coarse driver slice 200-4. In some embodiments, the function of the AND logic operator 250 is logically performed internal to the controller 229, and the controller 229 outputs to each coarse driver slice 200-4 the corresponding internal coarse code IC(n:0), which is based on the coarse control code C3(n:0) and the enabled/disabled state of the particular coarse driver slice 200-4. In such, embodiments, the controller 229 may not supply a separate first enable signal EN1 to each coarse driver slice 200-4.

Referring to FIG. 7B, the fine driver slice 200-5 includes the same driver stage 220-4 of the coarse driver slice 200-4, except that the plurality of binary weighed transistors 230(0) to 230(n) in the fine driver slice 200-5 are driven by an internal fine control code IF(n:0), which is based on the fine control code F(n:0) and the enabled/disabled state of fine driver slice 200-5. That is, in some embodiments, the coarse and fine driver slices 200-4 and 200-5 may be identical in structure, and be differentiated on the basis of the control code received.

According to some embodiments, the controller 229 applies the same fine control code F(n:0) to all fine driver slices 200-5, however, only enabled fine driver 200-5 slices receive the code in the form of the internal fine code IC(n:0). As detailed above, this may be accomplished via an AND logic operator 250 acting on the fine control code F(n:0) and the first enable signal EN1. However, as provided above, the function of the AND logic operator 250 may be logically performed internal to the controller 229, and the controller 229 may output to each fine driver slice 200-5 the corresponding internal fine control code IF(n:0), which is based on the fine control code F(n:0) and the enabled/disabled state of the particular fine driver slice 200-5. In such, embodiments, the controller 229 may not supply a separate first enable signal EN1 to each fine driver slice 200-5.

The controller 229 may set the coarse control code C3(n:0) to be the same as, or different from, the fine control code F(n:0).

As described above with reference to FIG. 7A, each of the coarse/fine driver slices 200-4/200-5 may be disabled by setting all bits of the internal coarse/fine control code IC(n:0)/IF(n:0) to zeros. A non-zero internal coarse/fine control code IC(n:0)/IF(n:0) results in the corresponding coarse/fine driver slices 200-4/200-5 being enabled.

The VM driver 100 may have any suitable number of coarse and fine driver slices. For example, the VM driver may have 30 total slices, the first four of which may be fine driver slices 200-5 and the remaining 26 of which may be coarse driver slices 200-4. According to some examples, when enabling driver slices, the controller 229 may enable the fine driver slices 200-5 (e.g., driver slices 1 through 4) first, before enabling any coarse driver slices 200-4 (e.g., driver slices 5-30).

In some embodiments, the coarse and fine slices 200-4 and 200-5 are identical except for the codes that they receive; however, embodiments of the present invention are not limited thereto. For example, in some embodiments, the fine slices 200-5 may not have a pull-down circuit, that is, may not include the pull-down transistor 222 and the impedance transistor 240.

While FIGS. 7A-7B illustrate driver slices capable of adjusting and calibrating the pull-up resistance, embodiments of the present invention are not limited thereto, and the coarse and fine driver slices may be modified to provide the capability to adjust and calibrate the pull-down resistance as well, or instead of the pull-up resistance. For examples, the impedance transistor 240 may be replaced with a plurality of binary weighed transistors (similar to transistors 230(0) to 230(n)), which allow for coarse and fine calibration of the pull-down circuit based on a multi-bit code received from the controller 229.

As will be recognized by a person of ordinary skill in the art, while the plurality of binary weighed transistors 230(0) to 230(n) are illustrated as being NMOS transistors, embodiments of the present invention are not limited thereto, and said transistor may be PMOS transistor if the polarity of the driving signals are also reversed.

Figure 8:
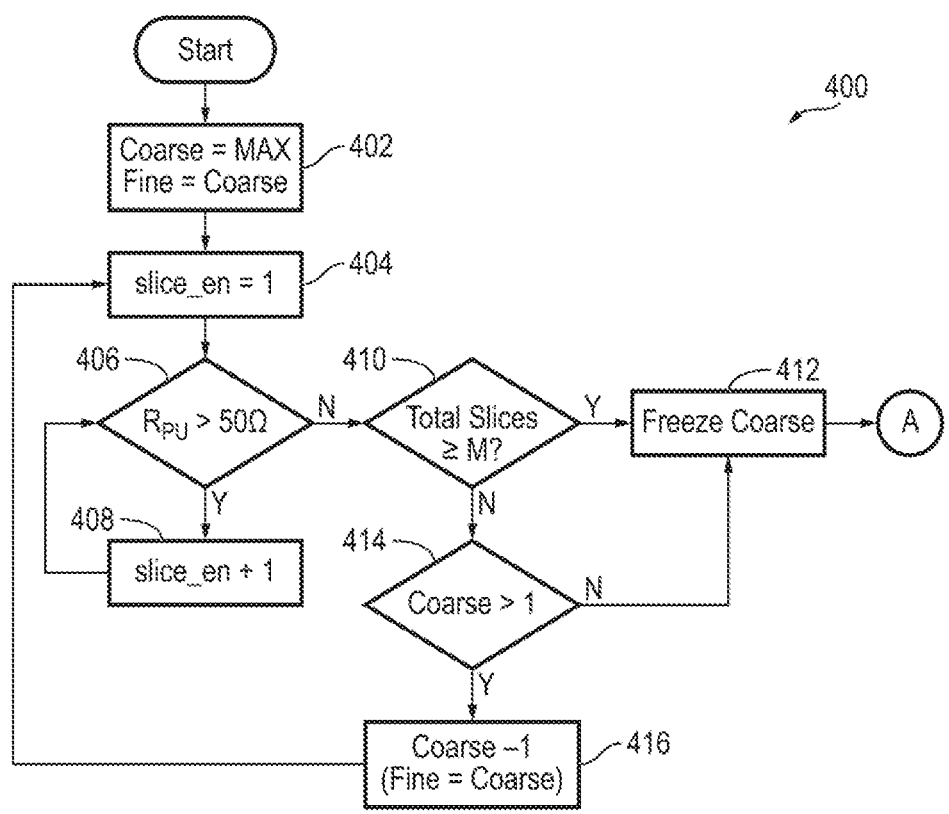
FIG. 8 is a flow diagram illustrating the process of performing coarse impedance calibration using coarse driving slices of the VM driver, according to some embodiments of the present invention.
Figure 9:
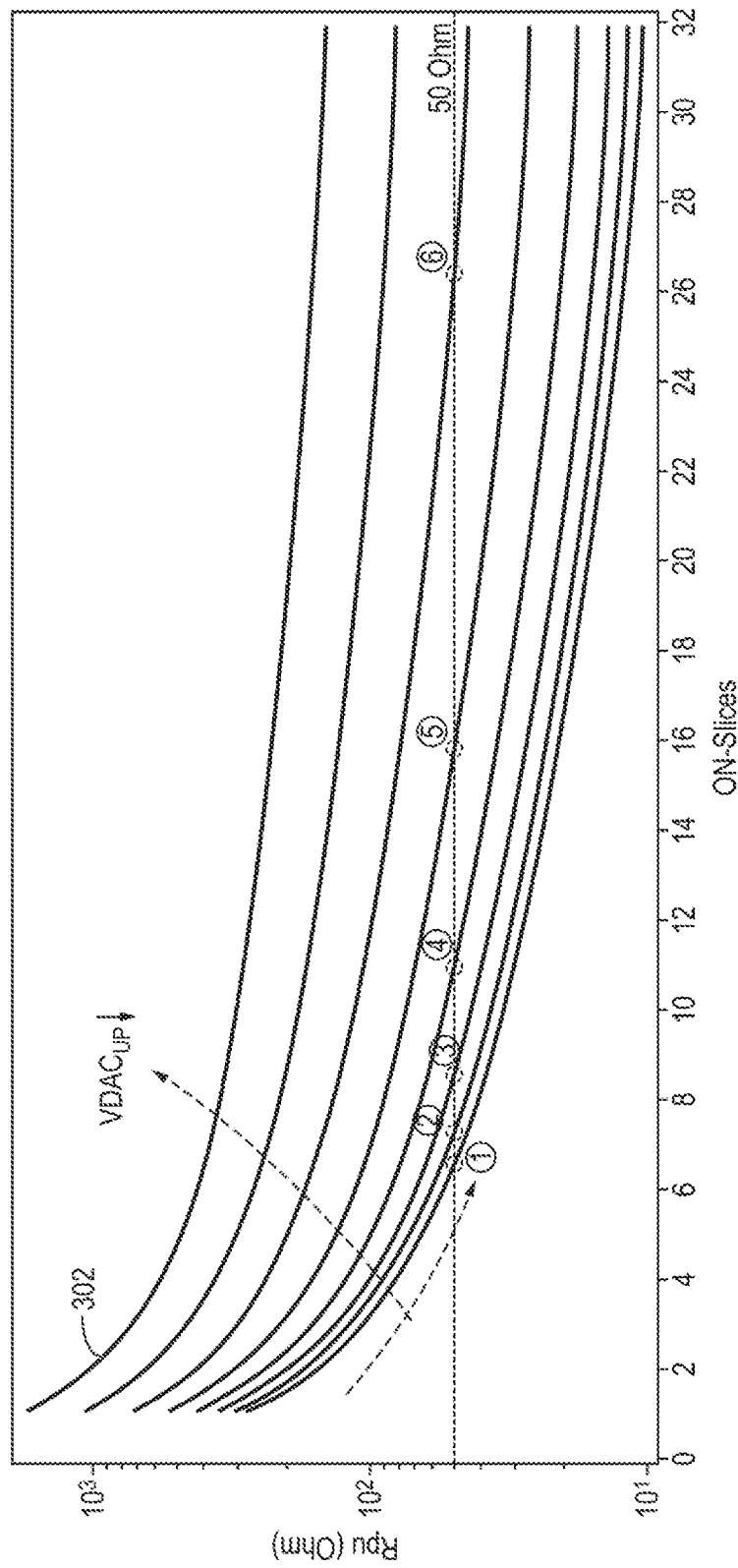
FIG. 9 is a graph illustrating the effect of coarse calibration on the pull-up resistance of the VM driver, according to some embodiments of the present invention.

FIG. 8 is a flow diagram illustrating the process 400 of performing coarse impedance calibration using coarse driving slices of the VM driver 100, according to some embodiments of the present invention. FIG. 9 is a graph illustrating the effect of coarse calibration on the pull-up resistance Rpu of the VM driver 100, according to some embodiments of the present invention.

Referring to FIG. 8, in act 402, the controller initiates coarse calibration of the pull-up resistance by initially setting the output of the programmable voltage source 236 to its maximum value (e.g., the high voltage VDD), in the embodiments of FIGS. 5-6A, or by setting the coarse control code C3(n:0) and the fine control code F(n:0) to all ones, in the embodiments of FIG. 7. At this initial stage, all of the coarse driver stages may be disabled/turned off. That is, in the embodiments of FIGS. 5-6A, the controller 229 sets the inverse enable signal ~EN1 of each driver stage 220-1/220-2 to a high voltage (e.g., the high voltage VDD) to turn off/disable the pull-up impedance transistor 230, or, in the embodiments of FIG. 7, the controller 229 sets the internal coarse control codes IC(n:0) and the internal fine control codes IF(n:0) to all zeros to turn off all of the binary weighed transistors 230(0) to 230(n) in all driver slices 200-4 and 200-5.

In act 404, the controller 229 activates only one of the driver slices. In the embodiments of FIGS. 5-6A, the controller 229 sets the inverse enable signal ~EN1 of one driver stage 220-1/220-2 to a low voltage (e.g., the ground voltage) to activate/turn on the corresponding pull-up impedance transistor 230. In the embodiments of FIGS. 7A-7B, the controller 229 sets the internal coarse/fine internal code IC(n:0)/IF(n:0) for a first driver slice 200-4/200-5 (e.g., a fine driver slice 200-5) to the coarse/fine control code C3/F (e.g., the fine control code F(n:0)), which initially is at all ones. The first enable signal may be set to a high voltage. In the examples of FIGS. 7A-7B, in which only the pull-up circuit is being calibrated, the second enable signal EN2 may be set to a low voltage (e.g., zero) to disable/deactivate the second impedance transistor 240 and the pull-down circuit. In embodiments in which both of the pull-up and pull-down resistances are calibrated, but the pull-up resistance is calibrated first, the second enable signal EN2 may be set to a low voltage (e.g., zero) as well while calibrating the pull-up resistance. However, if the pull-down resistance is calibrated before the pull-up resistance, in act 404, the EN2 may be a high or low voltage depending on whether the particular slice was enabled/disabled during the calibration of the pull-down resistance.

In act 406, the controller 229 measures the pull-up output resistance of the VM drive 100 and determines whether it is greater than the desired resistance (e.g., 50 Ω). If so, the controller 229 proceeds to act 408. Otherwise, the controller 229 proceeds to act 410. Here, the controller 229 measures the pull-up resistance of the VM drive 100 using any suitable method and system known in the art, and the embodiments of the present invention are not limited to any particular output resistance-measuring method or system.

In act 408, the controller 229 activates one more of the driver slices. In the embodiments of FIGS. 5-6A, the controller 229 sets the inverse enable signal ~EN1 of an additional driver stage 220-1/220-2 to a low voltage (e.g., the ground voltage) to turn on/activate the corresponding pull-up impedance 230. In the embodiments of FIGS. 7A-7B, the controller 229 sets the internal coarse/fine internal code IC(n:0)/IF(n:0) for an additional driver slice 200-4/200-5 to the coarse/fine control code C3/F (e.g., the fine control code F(n:0)), which initially is at all ones.

In act 410, the controller 229 determines whether the total number of activated/turned on driver slices is greater than or equal to the lowest desirable number of on slices (M) to guarantee/ensure a sufficiently small step size/calibration resolution (e.g., 5% of the desired resistance or 2.5 Ω), which corresponds to the smallest number of slices that need to be turned on in order to achieve the desired calibration resolution. In the example of FIG. 5, the lowest desirable number of on slices M may be 15. If the total number of activated/turned on driver slices is greater than or equal to M, the coarse calibration process is complete and the controller 229 proceeds to act 412. Otherwise, coarse calibration is not complete and the controller 229 proceeds to act 414.

In act 412, the controller 229 saves (or freezes) the coarse control code and proceeds to perform fine calibration. In the embodiments of FIGS. 5-6A, the controller 229 saves (or freezes) the coarse control code C1/C2, and in the embodiments of FIGS. 7A-7B, the controller 229 saves (or freezes) the coarse control code C3 (at this point the fine control code F may be equal to the coarse control code C3). At the conclusion of coarse calibration process 400, the pull-up output impedance of the VM driver 100 may be slightly below the desired value (e.g., 50 Ω).

In act 414, the controller 229 determines whether the coarse control code C1/C2/C3 is greater than one or not. If the coarse control code C1/C2/C3 is greater than one, it can be reduced further, and the controller 229 proceeds to act 416 where the controller 229 reduces the coarse control code C1/C2/C3 by one (i.e., by one LSB). In the embodiments of FIGS. 7A-7B, the controller 229 also reduces the fine control code F, as the controller 229 maintains the coarse and fine control codes C3 and F to be the same throughout the entire loop of the coarse calibration process 400. By reducing the coarse control code C1/C2/C3, the output impedance of the coarse slices increases, and the curve 302 shift up, as shown in FIG. 9, thus changing the crossover point with the desired output resistance (e.g., 50 Ω). After reducing the coarse code C1/C2/C3, the controller 229 proceeds back to act 404, where the controller 229 turns off/disables all coarse driver slices but one, and proceeds through the loop as described above. Otherwise, if the coarse control code C1/C2/C3 has reached one, the code cannot be reduced any further (without disabling all enabled driver slices) and the controller ends coarse calibration by proceeding to act 412.

In the example of FIG. 9, as the coarse control code C1/C2/C3 decreases by one at a time, the cross-over point of resistance-vs-number-of-slices curve 302 with the desired output impedance of 50 Ω shifts from point (1) to (2) to . . . (5) or (6) depending on the value of predetermined lowest desirable number of on slices M. For example, if the lowest desirable number of on slices M=13, the coarse calibration process settles at crossover point (5) after four iterations of the coarse calibration loop, which leads to a turning on 16 coarse driver slices and a calibration resolution (i.e., step size) of 3 Ω. However, if M=17, the coarse calibration process settles at crossover point (6) after five iterations of the coarse calibration loop, which leads to a turning on 29 coarse driver slices and a calibration resolution (i.e., step size) of 1.5 Ω. In relating the coarse calibration process 400 with the comparative example of FIG. 4, it may be said that the coarse calibration effectively aligns the crossover points of the curves 302 and 304 of FIG. 4.

As the number of on-slices increases, the driver stages do not use more power, as power consumption is proportional to the square of the power supply voltage VREG, which is constant, and inversely proportional to the output impedance, which is calibrated to be at the desired value (e.g., 50 Ω). However, as the number of on-slices increases, the pre-drive stages of the on-slices also increases, which leads to greater power consumption. The total number of on-slices, and hence the number of pre-driver stages may be reduced by performing fine calibration.

Figure 10:
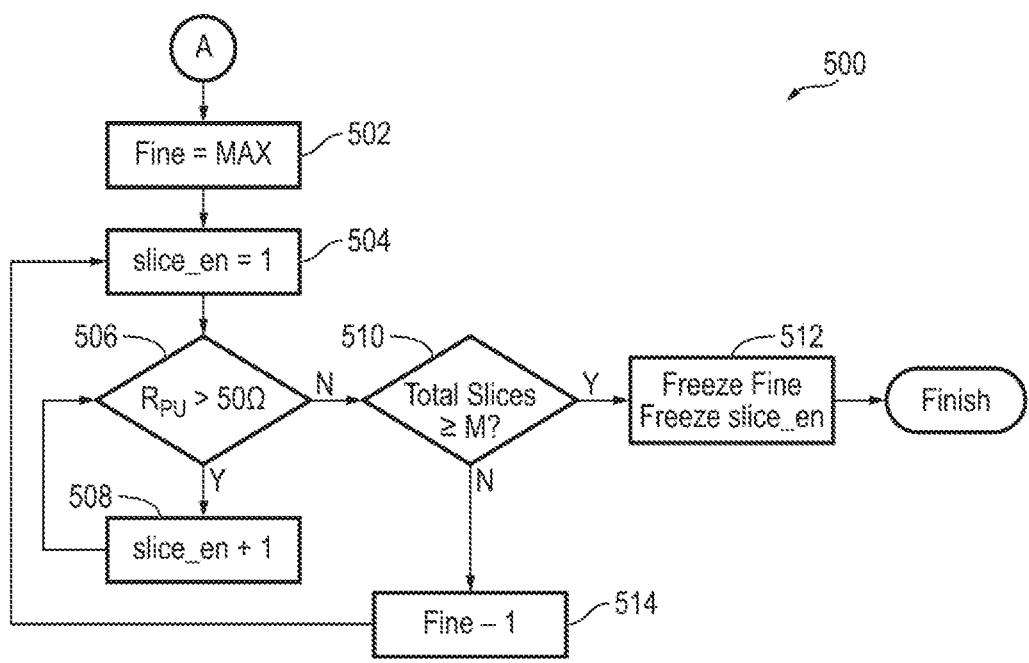
FIG. 10 is a flow diagram illustrating the process of performing fine impedance calibration using coarse and fine driving slices of the VM driver, according to some embodiments of the present invention.
Figure 11:
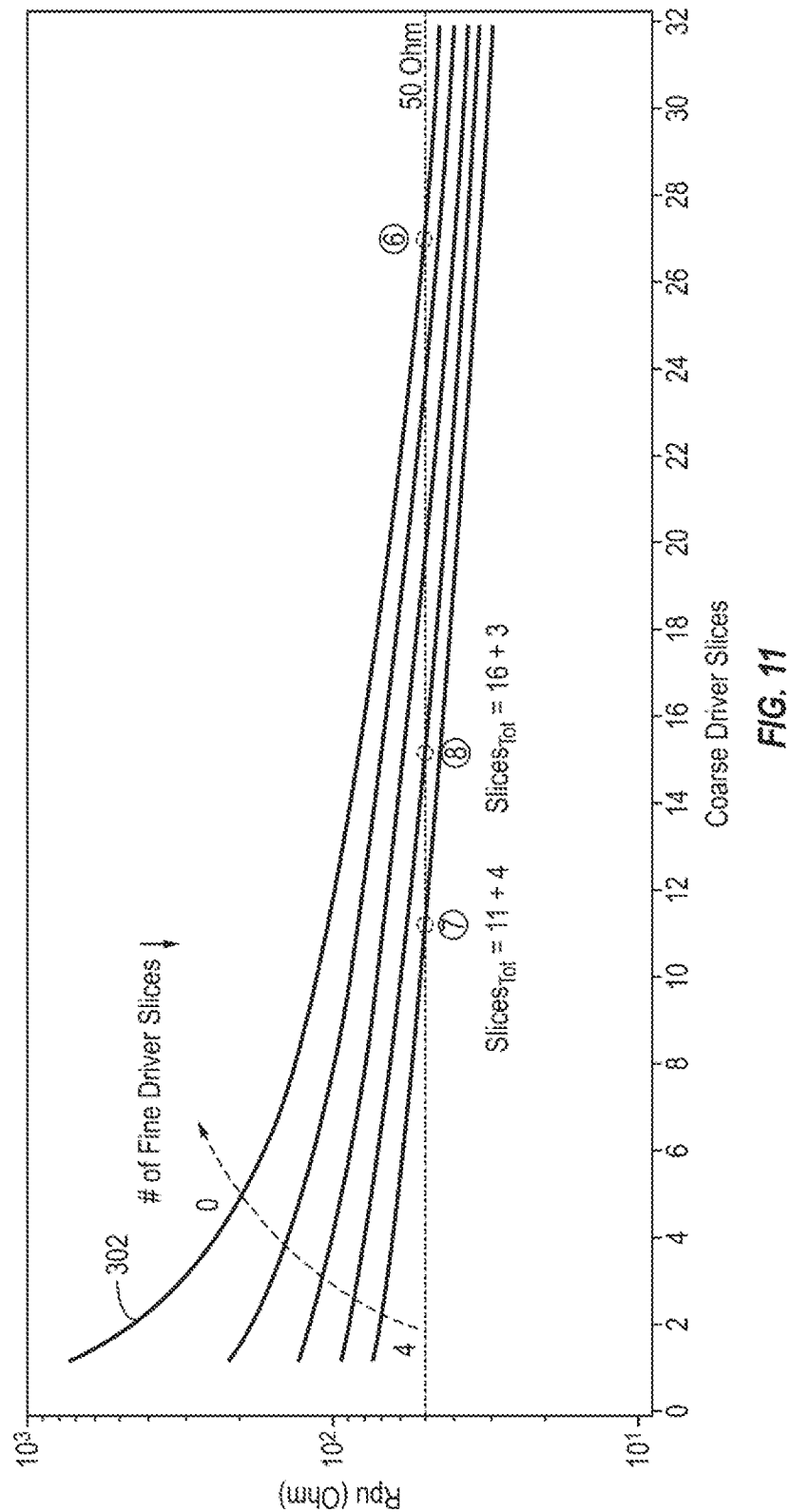
FIG. 11 is a graph illustrating the effect of fine calibration on the pull-up resistance of the VM driver, according to some embodiments of the present invention.

FIG. 10 is a flow diagram illustrating the process 500 of performing fine impedance calibration using coarse and fine driving slices of the VM driver 100, according to some embodiments of the present invention. FIG. 11 is a graph illustrating the effect of fine calibration on the pull-up resistance Rpu of the VM driver 100, according to some embodiments of the present invention.

Referring to FIG. 10, in act 502, the controller 229 initiates fine calibration of the pull-up resistance. In the embodiments of FIGS. 6A-6B, the controller 229 does so by initially connecting the gates of the impedance resistors 230 of the fine driver slices 200-3 to the high voltage VDD, by turning on the enable transistors 235 of the fine driver slices 200-3. Here, the controller may turn off the disable transistor 232 and the pass-through resistor 234 of each fine driver slice 200-3. In the embodiments of FIGS. 7A-7B, the controller sets the fine control code F(n:0) to all ones (e.g., "111" for a 3-bit code (where n=2)) to turn on all of the binary weighed transistors 230(0) to 230(n).

In act 504, the controller 229 activates only one of the driver slices. In the embodiments of FIGS. 6A-6B, the controller 229 sets the inverse enable signal ~EN1 of one driver stage 220-2 to a low voltage (e.g., the ground voltage) to turn on/activate the pull-up impedance 230. Here, the programmable voltage source 236 outputs the same frozen value that resulted from the coarse calibration process 400 of FIG. 8. In the embodiments of FIGS. 7A-7B, the controller 229 sets the internal coarse/fine internal code IC(n:0)/IF(n:0) for a first driver slice 200-4/200-5 (e.g., a fine driver slice 200-5) to the coarse/fine control code C3/F (e.g., the fine control code F(n:0)), which initially is at all ones. The first enable signal may be set to a high voltage. In the examples of FIGS. 7A-7B, in which only the pull-up circuit is being calibrated, the second enable signal EN2 may be set to a low voltage (e.g., zero) to disable/deactivate the second impedance transistor 240 and the pull-down circuit. In embodiments in which both of the pull-up and pull-down resistances are calibrated, but the pull-up resistance is calibrated first, the second enable signal EN2 may be set to a low voltage (e.g., zero) as well while calibrating the pull-up resistance. However, if the pull-down resistance is calibrated before the pull-up resistance, in act 504, the EN2 may be a high or low voltage depending on whether the particular slice was enabled/disabled during the calibration of the pull-down resistance.

In act 506, the controller 229 measures the pull-up output resistance of the VM drive 100 and determines whether it is greater than the desired resistance (e.g., 50 Ω). If so, the controller 229 proceeds to act 508. Otherwise, the controller 229 proceeds to act 510. Here, the controller 229 measures the pull-up resistance of the VM drive 100 using any suitable method and system known in the art, and the embodiments of the present invention are not limited to any particular output resistance-measuring method or system.

In act 508, the controller 229 activates an additional driver slice. In the embodiments of FIGS. 6A-6B, the controller 229 sets the inverse enable signal ~EN1 of an additional driver stage 220-2 to a low voltage (e.g., the ground voltage) to turn on/activate the corresponding pull-up impedance 230. In the embodiments of FIGS. 7A-7B, the order in which driver slices are turned on starts with fine driver slices 200-5, and then proceeds to coarse driver slices 200-4. As such, in act 508, when the additional driver slice to be enabled/turned on is a fine driver slice 200-5 (e.g., is one of the first four fine driver slices), the controller 229 supplies to the fine control code F(n:0) to the newly enabled fine driver slice 200-5. However, when the additional driver slice to be enabled/turned on is a coarse driver slice 200-4 (e.g., is one of the 25 coarse driver slices), the controller 229 supplies to the coarse control code C3(n:0) to the newly enabled coarse driver slice 200-4.

In act 510, the controller 229 determines whether the total number of activated/turned on driver slices (i.e., coarse and fine slices) is greater than or equal to the lowest desirable number of on slices (M) to guarantee a sufficiently small step size (e.g., 5% of the desired resistance or 2.5 Ω), which corresponds to the smallest number of slices that need to be turned on in order to achieve the desired calibration resolution. This is the same number M that was previously used in the coarse calibration process 400 of FIG. 8. If the total number of activated/turned on driver slices is greater than or equal to M, the fine calibration process is complete and the controller 229 proceeds to act 512. Otherwise, fine calibration is not complete and the controller 229 proceeds to act 514.

In act 512, the controller 229 saves or freezes status of each one of the coarse and fine driver slices as well as the total number of enabled slices (slice_en). That is, in the embodiments of FIGS. 6A-6B, the controller 229 saves/freezes the state of the enable signals (or inverse enable signal ~EN1) applied to each of the coarse and fine slices 200-2 and 200-3 and the state of the inverse pull-up high signal applied to the impedance transistor 230 of the fine slices 200-3. In the embodiments of FIGS. 7A-7B, the controller 229 saves/freezes the coarse and fine control codes C3(n:0) and F(n:0) applied to the coarse and fine slices 200-4 and 200-5 and the total number of enabled slices (slice_en).

In act 514, the controller 229 reduces the fine control code F(n:0) by one (i.e., by one LSB), in the embodiments of FIGS. 7A-7B. In the embodiments of FIGS. 6A-6B, the controller 229 turns off the enable transistors 235 of one of the fine driver slices 200-3 by, for example, setting the inverse pull-up high signal PUH to a high voltage, and connects the programmable voltage source 236 to the gate of the impedance transistor 230.

By reducing the fine control code F(n:0), the output impedance of the fine slices increases from a relative to the fine code F(n:0) being at maximum (i.e., all ones). Eventually, by iterating through the loop of process 500, the fine control code F(n:0) settles at a value that is higher than the coarse control code that was stored/frozen at the end of the coarse calibrating process 400. That is, the fine driver slices 200-5 will have lower pull-up impedance than the coarse driver slices 200-4. As, in the embodiments of FIGS. 7A-7B, the fine driver slices 200-5 are the first to be enabled, some of the enabled slices will have fine control codes applied while the remaining enabled slices will have coarse control codes applied to them. As a result, the resistance-vs-number-of-coarse-slices curve 302 that becomes more flat at lower slice numbers and the entire curve 302 moves down in resistance, as shown in FIG. 11. Consequently, in the example of FIG. 11, the crossover point of curve 302 with the desired output impedance of 50 Ω shifts from point (6) to (7) or (8) depending on the value of predetermined lowest desirable number of on slices M. For example, if the lowest desirable number of on slices M=17, the fine calibration process settles at crossover point (8) after three iterations of the fine calibration loop 500, which leads to a turning on 16 coarse driver slices and 3 fine driver slices, and a calibration resolution (i.e., step size) of 1.3 Ω. As compared to the example of FIG. 9, which illustrated the result of the coarse calibration process 400, once the fine calibration process 500 is complete, only 19 driver slices are enabled, as compared to the 29 of the coarse calibration process. Thus, fewer predriver stages are turned on, which results in less power consumption. Further, because the fine driver slices 200-5 have a higher control code applied to them than the coarse driver slices 200-4, the plurality of binary weighed transistors 230(0) to 230(n) have higher gate-to-source voltage VGS, and thus exhibit better dynamic range.

While the examples referred to a desired output resistance of 50 ohms +/−5%, as appreciated by a person of ordinary skill in the art, the teachings of the present application could be used to calibrate any desired output impedance and impedance tolerance.

While the above embodiments primarily describe the calibration of the pull-up output resistance of the VM driver via the first enable block, embodiments are not limited thereto, and the same or similar teachings may be used to calibrate the pull-down output resistance of the VM driver to a desired value and tolerance.

According to some embodiments of the present invention, the VM driver 102 may be utilized in, for example, any serial link (e.g., high-speed serial link), such as a high-definition multimedia interface (HDMI) link, a universal serial bus (USB) link, a peripheral component interconnect (PCI) link, an Ethernet link, and/or the like. However, embodiments of the present invention are not limited thereto.

The operations performed by the controller 229 may be described in terms of a software routine executed by one or more processors (in the VM driver or external to it) based on computer program instructions stored in memory. A person of skill in the art should recognize, however, that the routine may be executed via hardware, firmware (e.g. via an ASIC), or in combination of software, firmware, and/or hardware.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

Herein, supplying clock signals and carry signals may refer to providing a gate on voltage, and stopping the supply of clock signals and carry signals may refer to providing a gate off voltage.

It will be understood that, although the terms "first," "second," "third," etc., may be used herein to describe various elements, components, and/or sections, these elements, components, and/or sections should not be limited by these terms. These terms are used to distinguish one element, component, or section from another element, component, or section. Thus, a first element, component, or section discussed above could be termed a second element, component, or section, without departing from the spirit and scope of the invention.

It will also be understood that when an element is referred to as being "between" two elements, it can be the only element between the two elements, or one or more intervening elements may also be present.

The terminology used herein is for the purpose of describing particular embodiments and is not intended to be limiting of the invention. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the invention refers to "one or more embodiments of the invention." Also, the term "exemplary" is intended to refer to an example or illustration.

It will be understood that when an element or component is referred to as being "connected to" or "coupled to" another element or component, it can be directly connected to or coupled to the other element or component, or one or more intervening elements or components may be present. When an element or layer is referred to as being "directly connected to" or "directly coupled to" another element or component, there are no intervening elements or components present.

As used herein, the terms "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The high resolution voltage-mode driver and/or any other relevant devices or components, such as the controller, according to embodiments of the present invention described herein may be implemented utilizing any suitable hardware, firmware (e.g. an application-specific integrated circuit), software, or a suitable combination of software, firmware, and hardware. For example, the various components of the voltage-mode driver may be formed on one integrated circuit (IC) chip or on separate IC chips. Further, the various components of the voltage-mode driver may be implemented on a flexible printed circuit film, a tape carrier package (TCP), a printed circuit board (PCB), or formed on a same substrate. Further, the various components of the voltage-mode driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A method of performing coarse calibration of a voltage-mode (VM) driver comprising a plurality of driver slices connected in parallel, the method comprising:
setting, by a processor, a control code applied to activated driver slices of the plurality of driver slices to a maximum value to minimize an output resistance of the activated driver slices;
activating, by the processor, one driver slice of the plurality of driver slices by applying the control code to the one driver slice, while disabling other driver slices of the plurality of driver slices;
measuring, by the processor, an output resistance of the VM driver;
determining, by the processor, whether the output resistance of the VM driver is greater than a desired resistance;
in response to determining that the output resistance of the VM driver is greater than the desired resistance:
activating, by the processor, one more driver slice of the plurality of driver slices; and
in response to determining that the output resistance of the VM driver is less than or equal to the desired resistance:
determining, by the processor, whether a total number of activated driver slices is greater than or equal to a lowest desirable number of on slices; and
in response to determining that the total number of activated driver slices is less than the lowest desirable number of on slices, reducing, by the processor, the control code applied to activated driver slices.

2. The method of claim 1, wherein the control code is a digital code having a plurality of bits.

3. The method of claim 1, wherein disabling other driver slices of the plurality of driver slices comprises:
applying, by the processor, an internal control code having a minimum value to the other driver slices.

4. The method of claim 1, further comprising, in response to determining that the output resistance of the VM driver is greater than a desired resistance:
re-measuring, by the processor, the output resistance of the VM driver; and
determining, by the processor, whether the re-measured output resistance is greater than the desired resistance.

5. The method of claim 1, wherein reducing the control code applied to activated driver slices comprises:
determining, by the processor, whether the control code is greater than one least significant bit (LSB); and
in response to determining that the control code is greater than one LSB, reducing, by the processor, the control code by one least significant bit (LSB).

6. The method of claim 5, further comprising:
in response to determining that the control code is less than or equal to one LSB, storing, by the processor, a value of the control code as a coarse control code.

7. The method of claim 1, further comprising:
in response to determining that the total number of activated driver slices is greater than or equal to the lowest desirable number of on slices, storing, by the processor, a value of the control code as a coarse control code.

8. The method of claim 1, wherein the output resistance of the VM driver is a pull-up resistance or a pull-down resistance of the VM driver.

9. A method of performing fine calibration of a voltage-mode (VM) driver comprising a plurality of driver slices connected in parallel, the method comprising:
setting, by a processor, a fine control code applied to activated fine driver slices of the plurality of driver slices to a maximum value to minimize an output resistance of the activated driver slices;
activating, by the processor, one fine driver slice of the plurality of driver slices, while disabling other driver slices of the plurality of driver slices;
measuring, by the processor, an output resistance of the VM driver;
determining, by the processor, whether the output resistance of the VM driver is greater than a desired resistance;
in response to determining that the output resistance of the VM driver is greater than the desired resistance:
activating, by the processor, one more driver slice of the plurality of driver slices by applying the fine control code or a previously stored coarse control code based on the one more driver slice being a fine driver slice or a coarse driver slice; and
in response to determining that the output resistance of the VM driver is less than or equal to the desired resistance:
determining, by the processor, whether a total number of activated driver slices is greater than or equal to a lowest desirable number of on slices; and
in response to determining that the total number of activated driver slices is less than the lowest desirable number of on slices, reducing, by the processor, the fine control code applied to activated fine driver slices.

10. The method of claim 9, wherein disabling other driver slices of the plurality of driver slices comprises:
applying, by the processor, an internal control code having a minimum value to the other driver slices.

11. The method of claim 9, wherein the one more driver slice is a fine driver slice of the plurality of driver slices, and wherein the activating the one more driver slice comprises applying, by the processor, the fine control code to the one more driver slice.

12. The method of claim 9, wherein the one more driver slice is a coarse driver slice of the plurality of driver slices, and wherein the activating the one more driver slice comprises applying, by the processor, the previously stored coarse control code to the one more driver slice.

13. The method of claim 9, wherein the plurality of driver slices comprises one or more fine driver slices and one or more coarse driver slices, and wherein the activating the one more driver slice comprises activating, by the processor, one of the one or more coarse driver slices only when all of the one or more fine driver slices have been activated.

14. The method of claim 13, wherein a number of the one or more coarse driver slices is greater than a number of the one or more fine driver slices.

15. The method of claim 9, further comprising, in response to determining that the output resistance of the VM driver is greater than a desired resistance:

re-measuring, by the processor, the output resistance of the VM driver; and determining, by the processor, whether the re-measured output resistance of the VM driver is greater than the desired resistance.

16. The method of claim 9, wherein reducing the fine control code applied to activated driver slices comprises:

reducing, by the processor, the fine control code by one least significant bit (LSB).

17. The method of claim 9, wherein the fine control code has a value higher than that of the previously stored coarse control code.

18. A voltage-mode (VM) driver comprising:

a plurality of driver slices, each of the driver slices comprising:

a drive transistor coupled to an output of the VM driver and configured to activate in response receiving a driving signal D1 at a gate electrode of the drive transistor; and a plurality of binary weighed transistors coupled in parallel between a regulated voltage supply source and the drive transistor, and configured to adjust an output impedance of the VM driver in response to code bits of a control code received at gates of the plurality of binary weighed transistors; and a controller configured to calibrate the output impedance of the VM driver by supplying the control code to the plurality of binary weighed transistors, the controller being further configured to:

determine that an output resistance of the VM driver is less than or equal to a desired resistance;

determine that a total number of activated driver slices is less than a lowest desirable number of on slices; and in response to the determinations, reduce the control code applied to activated driver slices.

19. The VM driver of claim 18, wherein the drive transistor comprises a pull-up transistor, the driving signal is a pull-up driving signal, and the output impedance is a pull-up output impedance.

20. The VM driver of claim 18, wherein the drive transistor comprises a pull-down transistor, the driving signal is a pull-down driving signal, and the output impedance is a pull-down output impedance.

* * * * *